United States Patent
Criss-Puszkiewicz et al.

(10) Patent No.: US 6,491,298 B1
(45) Date of Patent: *Dec. 10, 2002

(54) THERMAL MANAGEMENT SYSTEM FOR A GAMING MACHINE

(75) Inventors: Cynthia Criss-Puszkiewicz, Reno, NV (US); Craig A. Paulsen, Reno, NV (US); John L. Beadell, Sparks, NV (US); Kehl T. Lesourd, Reno, NV (US); Eric L. Wagner, Sparks, NV (US)

(73) Assignee: IGT, Reno, NV (US)

( * ) Notice: Subject to any disclaimer, the term of this patent is extended or adjusted under 35 U.S.C. 154(b) by 10 days.

This patent is subject to a terminal disclaimer.

(21) Appl. No.: 09/605,098

(22) Filed: Jun. 27, 2000

(51) Int. Cl.$^7$ ................................................ H05K 5/00
(52) U.S. Cl. .................. 273/148 R; 454/184; 361/695; 463/46
(58) Field of Search ................................ 361/697, 695; 454/184; 165/80.3; 273/274, 148, 28.1; 463/46, 47; 312/236

(56) References Cited

U.S. PATENT DOCUMENTS

| | | | | |
|---|---|---|---|---|
| 5,120,060 A | * | 6/1992 | Parker et al. | 273/120 A |
| 5,649,997 A | | 7/1997 | Cavallero et al. | 95/284 |
| 5,956,227 A | * | 9/1999 | Kitaoka | 165/104.34 |
| 6,201,703 B1 | | 3/2001 | Yamada et al. | |
| 6,280,318 B1 | * | 8/2001 | Criss-Puszkiewicz et al. | 454/184 |

FOREIGN PATENT DOCUMENTS

JP          10314424 A   * 12/1998   ............. A63F/7/02

OTHER PUBLICATIONS

Maintenance Procedures: Game King 19" Slant–Top, Section 16, Fans, Oct. 15, 2000.
Maintenance Procedures: Vision Series/Game King 27" Slant–Top, Section 18, Fan, Aug. 13, 1999.

* cited by examiner

Primary Examiner—Benjamin H. Layno
Assistant Examiner—V K Mendiratta
(74) Attorney, Agent, or Firm—Beyer Weaver & Thomas, LLP

(57) ABSTRACT

A disclosed gaming machine provides a thermal management system comprised of fans, vents and a particular configuration of thermal sources (e.g. CPU, power supply, monitor) and gaming machine components (e.g. printer, coin hopper, etc.). For a given component packaging scheme within the gaming machine cabinet, the thermal management system uses natural convection and a system of fans to cool the gaming machine cabinet by pulling air over the thermal sources and directing the air towards the top of the gaming machine. The pulling action of the fans helps to maintain laminar flow within the gaming machine cabinet which reduces heat transfer with the gaming machine cabinet. Additionally, the fans are configured to prevent dust accumulation on sensitive components such as the CPU and other electronics and to minimize the noise level outside of the gaming machine.

44 Claims, 8 Drawing Sheets

THERMAL MANAGEMENT SYSTEM FOR A GAMING MACHINE

BACKGROUND OF THE INVENTION

This invention relates to game playing methods for gaming machines such as slot machines and video poker machines. More particularly, the present invention relates to thermal management systems for gaming machines.

There are a wide variety of devices that can comprise a gaming machine such as a slot machine or video poker machine. Some examples of these devices are lights, slot reels, ticket printers, card readers, speakers, bill validators, coin acceptors, display panels, key pads, bonus wheels, and button pads. These devices provide many of the features which allow a gaming machine to present a game. Some of these devices are built into the gaming machine. Often, a number of devices are grouped together in a separate box that is placed on top of the gaming machine. Devices of this type are commonly called a top box.

Typically, utilizing a master gaming controller, the gaming machine controls various combinations of devices that allow a player to play a game on the gaming machine and also encourage game play on the gaming machine. For example, a game played on a gaming machine usually requires a player to input money or indicia of credit into the gaming machine, indicate a wager amount, and initiate a game play. These steps require the gaming machine to control input devices including bill validators and coin acceptors to accept money into the gaming machine and recognize user inputs from devices including key pads and button pads to determine the wager amount and initiate game play.

As technology in the gaming industry progresses, the traditional mechanically driven reel slot machines are being replaced with electronic counterparts having CRT, LCD video displays or the like. These video/electronic gaming advancements enable the operation of more complex games, which would not otherwise be possible on mechanical-driven gaming machines. For example, in addition to reel slot machines, it is now common to observe stand-alone or multiple platform video electronic games including Keno, Blackjack, Poker, Pai Gow, or slots in even the smallest gaming establishments.

Typically, video/electronic gaming machines utilize numerous internal electrical components including, for example, a power supply, a monitor, a communication board, a sound system, a printer and a CPU. During extensive use, and due to the fact that many of these game devices are always "on" even when not being played, many of the internal electrical components require thermal management to prevent premature component failure. For example, CPUs typically generate a significant amount of heat but only operate properly within a specified temperature range. Thus, most CPUs require a thermal management system of some type to prevent the CPU from overheating and failing.

Within the gaming industry, the space occupied by a gaming machine is a critical commodity. While the functionality of gaming machines has increased via the introduction of new technology, the space and volume allotted to gaming machines has not increased. Thus, within the relatively constant volume offered by the gaming machine cabinet, newer electronic gaming devices such as printers, monitors and card readers must be packaged with older gaming devices such as coin hoppers, coin acceptors, and lock boxes which are still needed by the gaming machine.

With the limited space within the gaming machine cabinet and the addition of electronic components requiring thermal management, packaging to provide both functionality and thermal management is becoming an important issue within the gaming industry. Traditionally, thermal management within gaming machine cabinets has been provided by taking advantage of natural convection. With vents near the top and the bottom of the gaming machine cabinets, internally generated hot air is convected naturally towards the top of the gaming machine where it may be expelled out the top vent. Cool air is naturally drawn into to the gaming machine through the bottom vent. When necessary, this process may be aided by fans within the gaming machine. With mostly mechanical components that tend to be fairly heat tolerant, this simple process is adequate to provide thermal management for a gaming machine.

In modern gaming machines, natural convection is still utilized as part of the gaming machine thermal management system. However, with many heat sensitive electrical components, thermal management requires careful packaging and flow path analysis to ensure that local hot spots do not develop within the gaming machine cabinet that may cause an electrical component failure. For example, an electronic board is typically mounted to the back cabinet of the gaming machine. When a local hot spot develops in the back of the cabinet near the electronic board as the result of poor air circulation, the portion of the electronic board near the hot spot may fail. To improve circulation within the gaming machine cabinet and prevent local hot spots, fans are often placed within the gaming machine cabinet. Once a packaging scheme has been developed for the components within gaming machine cabinet, the fans must be carefully located to achieve the desired circulation patterns within the gaming machine cabinet. Often, the placement of fans and the development of a packaging scheme is an iterative process. Further, space limitations typically require the fans to be small and noise limitations require the fans to be quiet.

Another problem associated with gaming machine thermal management is that internal particulates and contaminates can often be passed from one internal component to another internal component due to the common circulation of the air. For example, within the gaming machine cabinet, there is often an accumulation of coin dust and other particulates generated from the action of coins with the coin hopper. This dust often consists of metallic particles such as nickel and copper from the coins, and carbon steel from the hopper. As a result, this conductive dust complicates the cooling of internal components. More particularly, fans may circulate the coin dust from within the gaming machine and then distribute and deposit it onto the components being cooled, as well as other internal components which do not require cooling. Such deposition of these conductive particulates may compromise the operation of sensitive components within the gaming machine, and may even cause shorting of circuitry. Thus, dust management is also considered in the thermal management system developmental process.

In view of the above, it would be desirable to provide thermal management systems for modern electronic gaming machines which overcome the limitations associated with electronic component heat and dust sensitivity in a gaming machine cabinet with significant space and volume restrictions.

SUMMARY OF THE INVENTION

This invention addresses the needs indicated above by providing a gaming machine with a thermal management system comprised of fans, vents and a particular configuration of thermal sources (e.g. CPU, power supply, monitor) and gaming machine components (e.g. printer, coin hopper, etc.). For a given component packaging scheme with the gaming machine cabinet, the thermal management system uses natural convection and a system of fans to cool the gaming machine cabinet by pulling air over the thermal sources and directing the air towards the top of the gaming machine. The pulling action of the fans helps to maintain laminar flow within the gaming machine cabinet which reduces heat build up within the gaming machine cabinet. Additionally, the fans are orientated to prevent dust accumulation on sensitive components such as the CPU and other electronics and to minimize the noise level outside of the gaming machine.

One aspect of the present invention provides a thermal management system for a gaming machine. The thermal management system can be generally characterized as including 1) a gaming machine cabinet with a front, a back opposite the front, a first side connecting the back and the front, a second side connecting the back and the front, a top and a bottom (there may be a sub-enclosure within the main cabinet), 2) one or more vents in the gaming machine cabinet where the one or more vents allow air from outside the gaming machine to enter the main cabinet enclosure and cool the gaming machine, 3) a monitor mounted within the gaming machine and viewable to a player facing the front of the gaming machine and allows a player to play a game on the gaming machine, 4) a power supply box connected to a motherboard mounted on the back of the gaming machine cabinet, 5) a CPU box connected to or containing the motherboard and a CPU and mounted to the cabinet via a CPU enclosure, 6) a first fan mounted to the power supply where the first fan pulls air through the power supply and thereby cools the power supply, 7) a second fan mounted to the CPU enclosure where the second fan pulls air through the CPU box and thereby cools the CPU box, and 8) a third fan mounted on the top of the gaming machine wherein the third fan pulls hot air rising from the monitor, the CPU and the power supply from the gaming machine cabinet and vents the hot air outside the gaming machine cabinet and thereby cools the gaming machine cabinet. The gaming machine may be a slant top gaming machine or upright gaming machine which provides one or more games such as a video slot game, a video poker game, video pai gow, video keno and video black jack. The fans may each pull a volume of air per unit of time within a specified range, may emit noise within a specified range and may have a diameter within a specified range. In a specific embodiment, the thermal management system may include a monitor shelf, which at least partially supports the monitor. When present, the monitor shelf defines a top side of the sub-assembly. The monitor shelf may contain one or more holes.

In preferred embodiments, the CPU box which is mounted on the CPU enclosure includes an inlet CPU box vent where the inlet CPU box vent is on a first side of the CPU box and an outlet CPU box vent where the outlet CPU box vent is on a second side of the CPU box opposite the first side of the CPU box. Typically, air is pulled into the CPU box inlet and across the CPU box to the outlet CPU box vent by the second fan. The air pulled through the CPU box cools a CPU mounted within the CPU box and prevents dust from within the main cabinet enclosure from entering the CPU box.

In preferred embodiments, air is typically drawn from outside the gaming machine cabinet through one or more of the main cabinet vents. The main cabinet vents may utilize louvered vent covers. One of the main cabinet vents may be near the inlet CPU box vent or near a power supply box inlet vent. The power supply box may additionally contain an outlet power supply vent on a second side opposite the side with the power supply box inlet vent. The first fan, which is mounted on the second side of the power supply box, pulls air into the power supply through the inlet power supply vent, through the power supply box and out the outlet power supply vent.

Another aspect of the invention provides a gaming machine where the gaming machine may be characterized as including 1) a gaming machine cabinet, 2) a monitor mounted within the gaming machine cabinet, 3) a CPU mounted near a first side of the gaming machine cabinet, 4) a power supply for the gaming machine mounted near the first side of the gaming machine cabinet, 5) a coin hopper mounted in the gaming machine cabinet, 6) a first fan mounted near the CPU and orientated to pull air over the CPU and push air toward the hopper and 7) a second fan mounted near the power supply and orientated to pull air over the power supply and toward the coin hopper. The power supply, the coin hopper and the CPU may be located below the monitor such that the orientations of the first and second fans with respect to one or more walls of the gaming machine cabinet cause air to flow upward within the gaming machine cabinet and cool the monitor.

In specific embodiments, one or more vents may be located on a first side of the gaming machine cabinet near the CPU and near the power supply. The gaming machine may include a power supply box having vents that encloses the power supply where the second fan is mounted on the power supply box. Also, the gaming machine may include a CPU enclosure having vents and supports a CPU box, which encloses the CPU where the first fan is mounted on the CPU enclosure.

Another aspect of the invention provides method of cooling a gaming machine having a monitor, a CPU and a power supply mounted in a gaming machine cabinet. The method may be characterized as including the following sequence: 1) drawing air into the gaming machine cabinet, 2) pulling air over the CPU, power supply and monitor; and 3) venting air out the top of the gaming machine cabinet. In this method, the air is drawn into the gaming machine through one or more vents on a side of the gaming machine cabinet that is near to one or both of the CPU and power supply. The air is drawn over the power supply and CPU and then upward by the monitor and then exits through the top of the gaming machine cabinet. The gaming machine may include a coin hopper that generates coin dust such that the air drawn into the cabinet directs coin dust away from the CPU.

These and other features of the present invention will be presented in more detail in the following detailed description of the invention and the associated figures.

DESCRIPTION OF THE PREFERRED EMBODIMENTS

Figure 1:
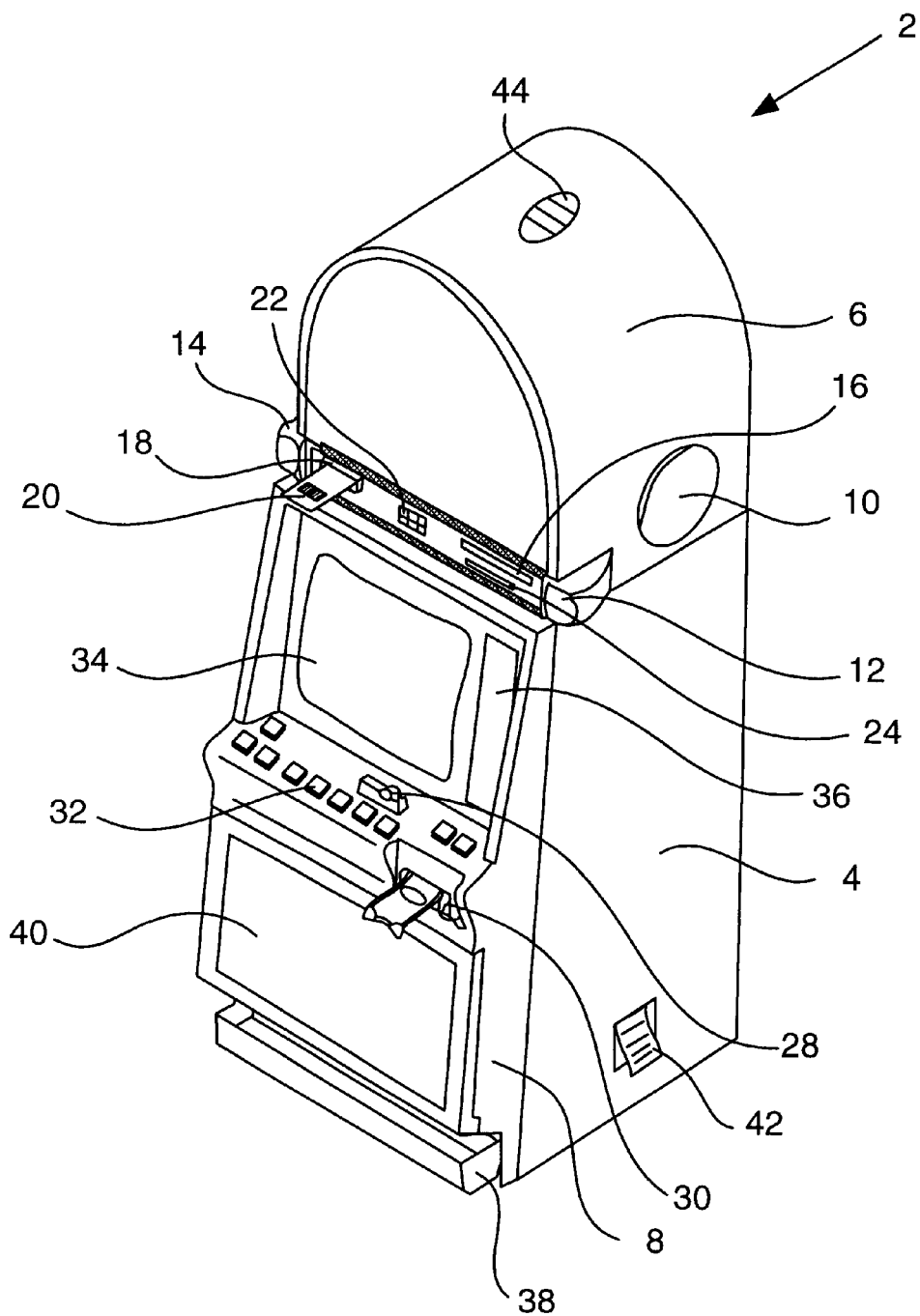
FIG. 1 is a perspective drawing of a gaming machine having a top box and other devices.

Turning first to FIG. 1, a video gaming machine 2 of the present invention is shown. Machine 2 includes a main cabinet 4, which generally surrounds the machine interior (not shown) and is viewable by users. The main cabinet includes a main door 8 on the front of the machine, which opens to provide access to the interior of the machine. Typically, the main door 8 and/or any other portals which provide access to the interior of the machine utilize a locking mechanism of some sort as a security feature to limit access to the interior of the gaming machine. Attached to the main door are player-input switches or buttons 32, a coin acceptor 28, and a bill validator 30, a coin tray 38, and a belly glass 40. Viewable through the main door is a video display monitor 34 and an information panel 36. The display monitor 34 will typically be a cathode ray tube, high resolution flat-panel LCD, or other conventional electronically controlled video monitor. The information panel 36 may be a back-lit, silk screened glass panel with lettering to indicate general game information including, for example, the number of coins played. The bill validator 30, player-input switches 32, video display monitor 34, and information panel are devices used to play a game on the game machine 2. The devices are controlled by circuitry (not shown) housed inside the main cabinet 4 of the machine 2. Many possible games, including traditional slot games, video slot games, video poker, and keno, may be provided with gaming machines of this invention.

The gaming machine 2 includes a top box 6, which sits on top of the main cabinet 4. The top box 6 houses a number of devices, which may be used to add features to a game being played on the gaming machine 2, including speakers 10, 12, 14, a ticket printer 18 which prints bar-coded tickets 20, a key pad 22 for entering player tracking information, a fluorescent display 16 for displaying player tracking information and a card reader 24 for entering a magnetic striped card containing player tracking information. Further, the top box 6 may house different or additional devices than shown in the FIG. 1. For example, the top box may contain a bonus wheels or a back-lit silk screened panel which may be used to add bonus features to the game being played on the gaming machine. During a game, these devices are controlled and powered, in part, by circuitry (not shown) housed within the main cabinet 4 of the machine 2.

The gaming machine is shown with two vents, 42 and 44. A first vent 42 is located near the bottom of the gaming machine while a second vent 44 is located on the top of the top box 6. This vent configuration allows cool air into the gaming machine through the bottom vent 42. As air entering the gaming machine from the bottom vent 42 is heated by components within the gaming machine, it is naturally convected toward the top of the gaming machine where it may exit through the top vent 44. Typically, the top box 6 will contain a hole or vent which allows hot air from the main cabinet 4 to enter into the top box and exit through the vent 44. When the top box 6 is removed from the gaming machine, hot air from the gaming machine cabinet may exit from a vent (not shown) on top of the gaming machine. The vent locations may change depending the packaging of components within the gaming machine 2. The relationship between vent locations and packaging is described with reference to FIGS. 2A, 2B, 3A and 3B.

Understand that gaming machine 2 is but one example from a wide range of gaming machine designs on which the present invention may be implemented. For example, not all suitable gaming machines have top boxes or player tracking features. Further, some gaming machines have two or more game displays—mechanical and/or video. And, some gaming machines are designed for bar tables and have displays that face upwards. Those of skill in the art will understand that the present invention, as described below, can be deployed on most any gaming machine now available or hereafter developed.

Returning to the example of FIG. 1, when a user wishes to play the gaming machine 2, he or she inserts cash through the coin acceptor 28 or bill validator 30. At the start of the game, the player may enter playing tracking information using the card reader 24, the keypad 22, and the florescent display 16. Further, other game preferences of the player playing the game may be read from a card inserted into the card reader. During the game, the player views game information using the video display monitor 34.

During the course of a game, a player may be required to make a number of decisions, which affect the outcome of the game. For example, a player may vary his or her wager on a particular game, select a prize for a particular game, or make game decisions which affect the outcome of a particular game. The player may make these choices using the player-input switches 32, the video display monitor 34 or using some other device which enables a player to input information into the gaming machine. During certain game events, the gaming machine 2 may display visual and auditory effects that can be perceived by the player. These effects add to the excitement of a game, which makes a player more likely to continue playing. Auditory effects include various sounds that are projected by the speakers 10, 12, 14. Visual effects include flashing lights, strobing lights or other patterns displayed from lights on the gaming machine 2 or from lights behind the belly glass 40. After the player has completed a game, the player may receive game tokens from the coin tray 38 or the ticket 20 from the printer 18, which may be used for further games or to redeem a prize. Further, the player may receive a ticket 20 for food, merchandise, or games from the printer 18.

Figure 2A:
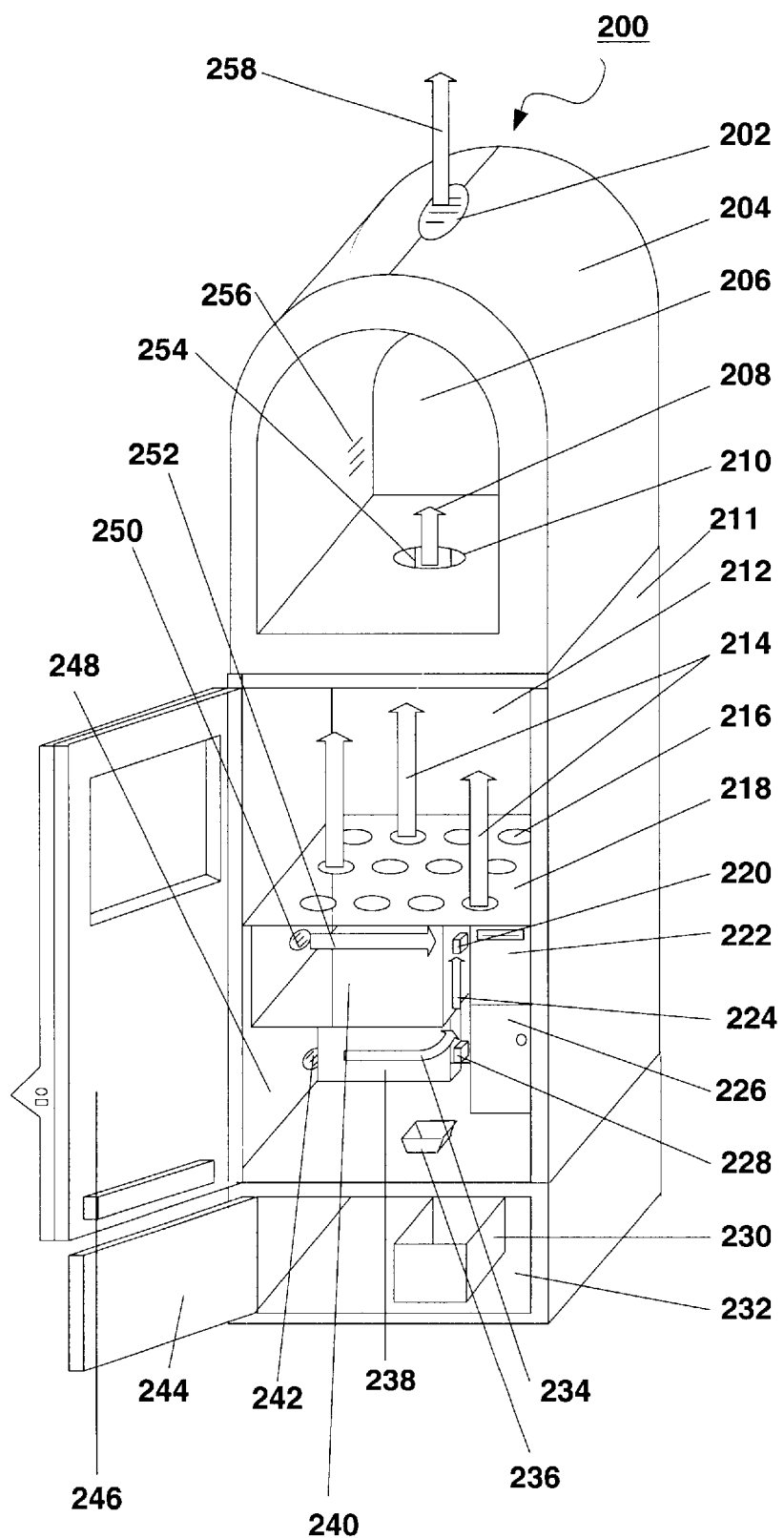
FIGS. 2A and 2B are a side view and a perspective drawing of an upright gaming machine with air flow patterns within the gaming machine.
Figure 2B:
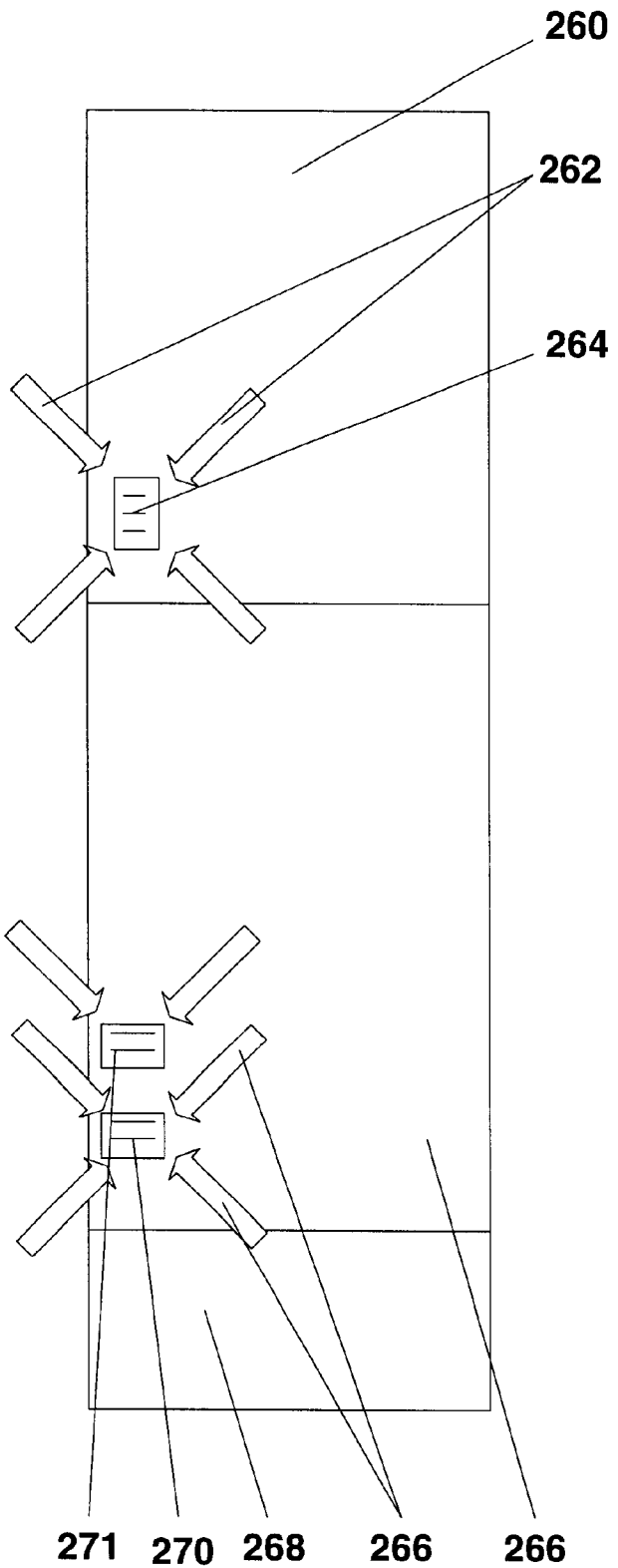

FIGS. 2A and 2B are a side view and a perspective drawing of an upright gaming machine with air flow patterns within the gaming machine. In FIG. 2A, the gaming machine cabinet 211 is shown with the cabinet door 246 open. The cabinet door 246 comprises the front of the gaming machine cabinet 211. The gaming machine cabinet 211 also includes a back opposite the front door 246 and two sides opposite one another connecting the front and the back of the gaming machine 200. With the cabinet door 246 open, some of the gaming components within the upright gaming machine 200 are exposed. For the purposes of clarity of illustrating the air flow within the gaming machine, all of the gaming machine components that may be mounted within the gaming machine are not shown. For example, a monitor is located in the monitor enclosure 212. As another example, a coin hopper may be located within the main cabinet enclosure 248 above the drop box slot 236.

The bottom of the upright gaming machine 200 rests on the top of a drop stand 232. The drop stand contains a drop stand door 244 and a drop box 230. Typically, a portion of the "house" take, which is a percentage of money or indicia of credit deposited into the gaming machine, is stored in the drop box 230. The coins or indicia of credit enter the drop box from the main cabinet enclosure 248 via the drop box slot 236.

A top box 204 is resting on the top of the gaming machine 200. Typically, as described with reference to FIG. 1, a number of gaming devices may be mounted within the top box 204 including a player tracking device, lights, a sound system, a card reader and a printer. To illustrate the air flow patterns within the top box, only the top box cabinet and vents are shown.

The monitor enclosure 212 and the cabinet enclosure 248 are the two main enclosures within the gaming machine cabinet 211. The top of the main cabinet enclosure 248 is a monitor shelf 218 which supports a monitor when it is in the gaming machine 200. The bottom and the sides of the main cabinet enclosure 248 are portions of the gaming machine cabinet 211. The front of the main cabinet enclosure 248 is a portion of the cabinet door 246. A number of gaming components including a bill validator 222, a lock box 226, a power supply 238, a CPU enclosure 240, a printer (not shown), a CPU box (not shown), and a coin hopper (not shown) may be located within the main cabinet enclosure 248. The location or packing of each device within the gaming cabinet 211 is important because the gaps and spaces between the devices determine the air circulation patterns within the gaming machine cabinet 211 and main cabinet enclosure 248.

The major thermal sources within the gaming machine cabinet 211 are the CPU, the power supply 238, and the monitor. The CPU is mounted within a CPU box where the CPU box is designed to fit within the CPU enclosure 240. The CPU and CPU box are described with reference to FIGS. 5A and 5B. The CPU box and power supply 238 are typically connected to an electronic board mounted on the back of the gaming machine cabinet. Typically, there is a maximum operational temperature for the CPU, the power supply 238 and the monitor. When the maximum operational temperature is exceeded for any of the devices, the device may fail or cease to operate properly. For example, the CPU may begin to malfunction and fail when the temperature within the CPU box exceeds 100° F.

To prevent device malfunctions from over-heating, a thermal management system is employed. The thermal management system utilizes the fans, the vents, the packaging/layout of the devices within the gaming machine cabinet and the thermal properties of the devices to prevent any of the devices from overheating. For example, the power supply 238 is contained within a power supply box. A power supply fan 228 is mounted to the power supply box. The power supply box contains an inlet vent and an outlet vent (Details of the power supply box are described with reference to FIGS. 4A and 4B). The inlet vent may be placed near a vent 242 on the side of the gaming machine cabinet 211. The location of the vent relative to the power supply inlet is selected to provide sufficient cooling for the gaming machine components within the cabinet. The distance of the power supply inlet vent to the edge of the nearest vent 242 is usually between about 2 and 4 inches. When the fan is operating, it pulls cool air from outside the gaming machine 200 through the vent 242 and into the power supply through the power supply box inlet and across the power supply. Then, air is drawn through the outlet of the power supply and blown upwards towards the monitor. The air flow patterns across the power supply and towards the top of the gaming machine are indicated by the arrows 234 and 224.

When a CPU box is mounted within the CPU enclosure 240, a CPU enclosure fan 220 mounted to the CPU enclosure, pulls cool air from a vent on the side of the gaming machine cabinet through a vent 250 or hole in the CPU enclosure 240 and into an inlet in the CPU box. The distance of the CPU inlet vent to the edge of the nearest vent is usually between about 2 and 4 inches. Then, air is drawn across the CPU box, through an outlet on the CPU box, through a hole in the CPU enclosure 240 and pushed outward by the fan. In one embodiment, a fan may be mounted on the outside of the CPU box above the CPU outlet vent. When the air hits the side of the bill validator enclosure, the air is directed towards the top of the gaming machine. The air flow pattern through the CPU box and CPU enclosure is indicated by the arrow 252. The vent on the side of the gaming machine may be located such that the power supply fan 228 and the CPU enclosure fan 220 draw air in from the same vent 242 or the power supply inlet and the CPU box inlet may each be located near separate vents.

The fans are designed to pull air into the gaming machine cabinet 211 to maintain laminar flow which may prevent particulate contamination. When the fans are located on the opposite side of the power supply and the CPU enclosure 240 and push air into the CPU box and the power supply box, the flow patterns tend to become turbulent. Turbulent air flow tends to provide better heat transfer characteristics than laminar flow because the laminar flow leaves a thicker boundary layer of hot air near the surface of a hot component, such as a power supply 238, while a turbulent boundary layer is thinner and provides more mixing of the hot air near the surface with the air being moved by the fans above the component. A higher mixing rate for the turbulent flow may provide more cooling to a hot component. However, the generally higher mixing rate for the turbulent flow as compared to the laminar flow also tends to allow more contaminants, such as coin dust, to be picked up off the surface of the various components within the gaming machine. When picked up off the surface, the surface contaminants may be deposited on the CPU components or the power supply components causing damage. For example, metallic coin dust may cause shorts within the CPU components. Thus, to minimize particulate contamination, the fans are arranged and sized to maintain laminar flow while still providing the necessary amount of cooling to the components within the gaming machine.

Another factor for placing the fans near the interior of the gaming machine and away from the vents on the side of the gaming machine is fan noise. When the fans are placed near the vents, the amount of noise emitted by the fans, which may be perceived by a player playing a game on the gaming machine, is significantly increased. When the fans are too noisy, a player may choose not to play a game on the .gaming machine or may reduce their game play. To reduce fan noise, the location of the fan and the inherent amount of noise of the fan are considered. Other factors considered in fan selection are the size, the cost, and the volume of air moved by the fan per second. For example, the diameter of the power supply fan is usually between about 2 and 3 inches with one embodiment about 2.36 inches and the diameter of the CPU enclosure fan is usually between about 3 and 4 inches with one embodiment about 3.15 inches. Typically, the fans are between about 0.8 and 1.2 inch thick with one embodiment about 1 inch thick. Usually, the fans are mounted in a square enclosure with a length and width about the same diameter of the fan. A few manufacturers of the fans, which may be used in this invention are Delta Electronics, Tapei, Taiwan, Globe Motor, Dayton, Ohio, ebm/PAPST, Farmington, Connecticut or NIDEC/Power General, Canton, Mass. Some operating properties for the power supply fan are an air flow rate of between about 15 and 25 cubic feet a minute (CFM) and a noise level of below 44 decibels (dB) but preferably closer to 30 dB. Some operating properties for the CPU enclosure fan are an air flow rate of between 35 and 45 CFM and a noise level of below 44 dB but preferably closer to 30 dB. These types of fans may be used in other locations of the gaming machine as described below.

The power supply fan 228 and the CPU enclosure fan 220 are orientated and placed to move air to through the monitor shelf 218 and by the monitor when it is placed on top of the monitor shelf 218. The air moving upward past the monitor towards the top of the gaming machine as shown by the arrows 214 tends to cool the monitor. The flow path toward the top of the gaming machine is aided by the natural convection of the hot air. The monitor shelf 218 contains a number of holes 216 which allow air to flow through the monitor shelf. Typically, the shape of the holes are elliptical. The elliptical shape is chosen to minimize the strength lost from cutting holes in the monitor shelf and maximize air flow.

After the air rises past the monitor it typically exits the gaming machine cabinet 211 through a vent on the top of the gaming machine. A fan 254 may be located below this vent to push hot air outside of the gaming machine cabinet or the fan may be located at the bottom of the top box 204 to pull air into the top box 204. The diameter of the fan 254 is usually between about 3 and 4 inches with one embodiment about 3.15 inches. When the top box 204 sits on top of the gaming machine cabinet 211, the hot air from the gaming machine cabinet may be vented into to the top box as shown by the arrow 208. Hot air from the top box may exit the top box via one or more vents including 256 and 202. Hot air exiting from the top box is indicated by the arrow 258.

As mentioned above, the accumulation of metallic dust on sensitive electrical components may cause thermal and electrical problems. The CPU enclosure fan 220 and power supply fan 228 are orientated to prevent coin dust from accumulating on the CPU and the electronic components mounted on the back plane of the gaming machine cabinet 211. A major source of metallic dust is the coin hopper (not shown) which is typically located above the drop box slot 236. The air flow patterns 252 and 234 are designed to prevent metallic dust from accumulating on the CPU, the power supply 238 or other sensitive electronic components.

FIG. 2B is a side view of the gaming machine in FIG. 2A. The sides of the top box 260, cabinet 266, and drop stand are shown. A vent 270 is located on the side 266 of the gaming machine cabinet. The vent allows cool air 266 from outside the gaming machine 200 to enter the gaming machine cabinet. Typically, the vent 270 utilizes a louvered vent cover. The louvered inlets are added to prevent tampering with the components within the gaming machine. The vent 270 may contain filters to prevent outside dust from entering the gaming machine. The vent 270 is located and sized to provide the proper air flow and cooling to the components within the gaming machine cabinet 211. In one embodiment, a second vent 271 may be located above the vent 270 with a similar design as vent 270. Typically, the one or more vents are located near the CPU box and power supply box inlets. However, the vent is usually off-set from the CPU box inlet to prevent tampering with the CPU. Additionally, one or more vents may be utilized on the gaming machine i.e. a first vent may be placed near CPU box inlet and another vent may be placed near the power supply inlet.

A second vent 264 may be located on the side of the top box. The vent 264 may allow cool air 262 to enter the top box from outside the gaming machine to enter the top box. The second vent may aid in the natural convection process. The vent is located and sized to provide the necessary cooling and air flow within the top box. However, in some cases, the second vent is not needed and may not be included with the top box.

Figure 3A:
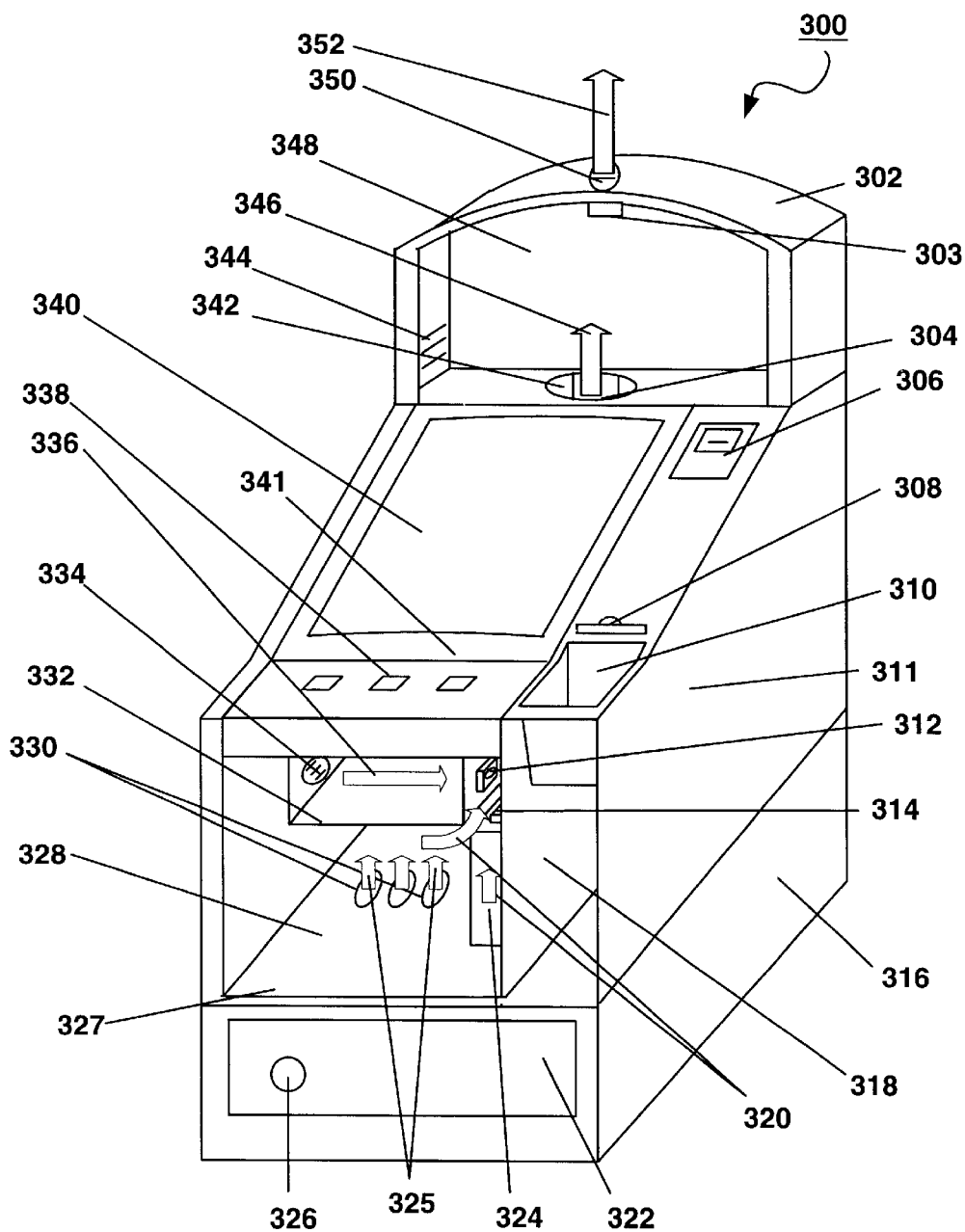
FIGS. 3A and 3B are a bottom view and a perspective drawing of slant top gaming machine with air flow patterns within the gaming machine.
Figure 3B:
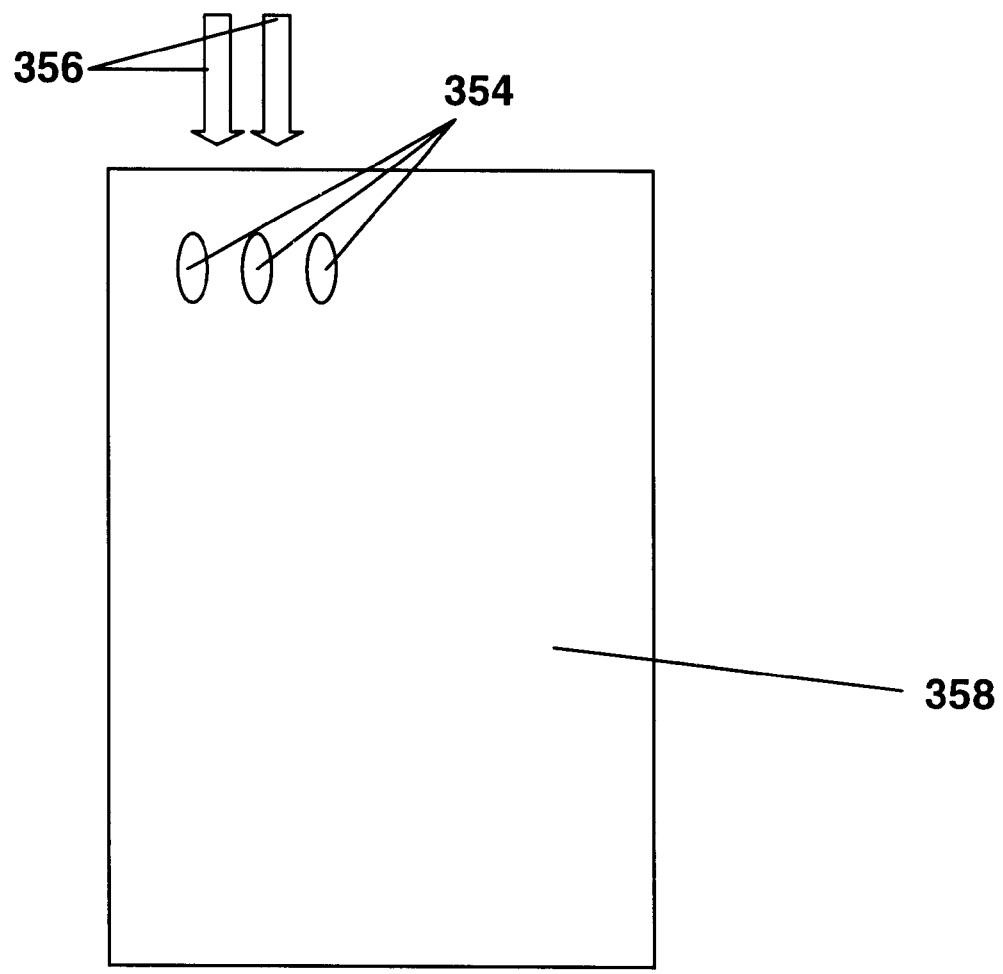

FIGS. 3A and 3B are a side view and a perspective drawing of slant top gaming machine with air flow patterns in the gaming machine. In FIG. 3A, the gaming machine cabinet 311 is shown with the front of the cabinet exposed. Typically, a door (not shown) and other gaming machine components are used to cover the front of the cabinet 311. The gaming machine cabinet 311 also includes a back opposite the front door and two sides opposite one another connecting the front and the back of the gaming machine 300. With the front door removed, some of the gaming components within the slant top gaming machine 300 are exposed. For the purposes of clarity of illustrating the air flow within the gaming machine, all of the gaming machine components that may be mounted within the gaming machine are not shown. For example, a printer is usually located in the main cabinet enclosure 328 or coin hopper is usually located in the hopper enclosure 318.

The bottom 327 of the slant top gaming machine 300 rests on the top of a drop stand 316. The drop stand contains a drop stand door 322 and a drop box (not shown). Typically, a portion of the "house" take, which is a percentage of money or indicia of credit deposited into the gaming machine, is stored in the drop box. A top box 302 is resting on portion of the top of the gaming machine 300. Typically, as described with reference to FIG. 1, a number of gaming devices may be mounted within the top box 302 including a player tracking device, lights, a sound system, a card reader and a printer. To illustrate the air flow patterns, only the top box cabinet and vents, 344 and 350, are shown.

The top of the gaming machine cabinet 311 is comprised of the portion supporting the top box 302, the flat area containing the input buttons 338 and the coin tray 310, and the slanted area around the monitor 340 and the bill validator 306. A top hatch door 341, which prevents the monitor 340 from being lifted out of the cabinet 311, is comprised of the flat area with the input buttons 338 and the slanted area over the monitor 340. The top hatch door 341 is hinged where the slanted area over the monitor 340 and the flat area supporting the top box 302 intersect and opens upwards.

The hopper enclosure 318 and the main cabinet enclosure 328 are the two main enclosures within the gaming machine cabinet 311. The top of the main cabinet enclosure 328 is the top hatch 341, which secures the monitor 340 when it is in the gaming machine 300. The bottom and sides of the main cabinet enclosure 328 are portions of the gaming machine cabinet 311. Also, one side of the main cabinet enclosure 328 may be one side of the hopper enclosure 318. The front of the main cabinet enclosure 328 is a portion of the front door (not shown) and possibly the front of a gaming device such as a printer. A number of gaming components including a power supply 324, a CPU enclosure 332, a printer (not shown), a CPU box (not shown), and a monitor 340 may be located within the main cabinet enclosure 328. The location of each device is important because the gaps and spaces between the devices determine the air circulation patterns within the gaming machine cabinet 311 and the main cabinet enclosure 328.

The major thermal sources within the gaming machine cabinet 311 are the CPU, the power supply 324, and the monitor 340. The CPU is mounted within a CPU box where the CPU box is designed to fit within the CPU enclosure 332. The CPU and CPU box are described with reference to FIGS. 5A and 5B. The CPU box and power supply 324 are typically connected to an electronic board mounted on the back of the gaming machine cabinet 311. Typically, there is a maximum operational temperature for the CPU, the power supply 324 and the monitor 340. When the maximum operational temperature is exceeded for any of the devices, the device may fail or cease to operate properly. For example, the monitor 340 may begin to malfunction and fail when the temperature within the monitor enclosure exceeds 100° F.

To prevent device malfumctions from over-heating, a thermal management system is employed. The thermal management system utilizes the fans, the vents, the packaging and the layout of the devices and the thermal properties of the devices to prevent any of the devices from overheating. For example, the power supply 324 is contained within a power supply box. A power supply fan 314 is mounted to the power supply box. The power supply box contains an inlet vent and an outlet vent (Details of the power supply box are described with reference to FIGS. 4A and 4B). The power supply inlet vent is near vents or holes 330 on the bottom of the gaming machine cabinet 311. The location of the vent relative to the power supply inlet is selected to provide sufficient cooling for all of the gaming machine components within the cabinet. The distance of the power supply inlet vent to the edge of the nearest vent 334 is usually between about 1 and 2 inches. In one embodiment, the distance is about 1.5 inches. When the fan is operating, it pulls cool air 325 from the drop stand 316 through the vents 330 and into the power supply 324 through the power supply box inlet and across the power supply. Then, air is drawn through the outlet of the power supply and blown upwards towards the monitor 340. The air flow patterns across the power supply and towards the top of the gaming machine are indicated by the arrows 320.

When a CPU box is mounted within the CPU enclosure 332, a CPU enclosure fan 312 mounted to the CPU enclosure, pulls cool air rising from the bottom of the gaming machine cabinet 311 from the vent holes 330 through a vent 334 or hole in the CPU enclosure 332 and into an inlet in the CPU box. The distance of the CPU box inlet vent to the edge of the nearest vent 334 is usually between about 9 and 11 inches. In one embodiment, the distance is about 10 inches. Then, air is drawn across the CPU box, through an outlet on the CPU box, through a hole in the CPU enclosure 332 and pushed outward by the CPU enclosure fan 312. When the air from the fan impacts the side of the hopper enclosure 318, the air is directed towards the top of the gaming machine 300. The air flow pattern through the CPU box and CPU enclosure 332 is indicated by the arrow 336.

The fans are designed to pull air into the gaming machine cabinet 311 to maintain laminar flow. When the fans are located on the opposite side of the power supply 324 and the CPU enclosure 332 and push air into the CPU box and the power supply box, the flow patterns tend to become turbulent. When the gaming machine is operating, the turbulent flow patterns significantly reduce the amount of cooling provided by the fans and tend to raise the temperature of the main cabinet enclosure 328.

Another factor for placing the fans near the interior of the gaming machine and away from the vents on the side of the gaming machine is fan noise. When the fans are placed near the exterior of the gaming machine, the amount of noise emitted by the fans, which may be perceived by a player playing a game on the gaming machine, is significantly increased. When the fans are too noisy, a player may choose not to play a game on the gaming machine or may reduce their game play. To reduce fan noise, the location of the fan and the inherent amount of noise of the fan are considered. Other factors considered in fan selection are the size, the cost, and the volume of air moved by the fan per second. For example, the diameter of the power supply fan is usually between about 2 and 3 inches with one embodiment about 2.36 inches and the diameter of the CPU enclosure fan is usually between about 3 and 4 inches with one embodiment about 3.15 inches. Usually, the fans are mounted in a square enclosure with a length and width about the same diameter of the fan. Typically, the fans are about 1 inch thick. A few manufacturers of the fans, which may be used in this invention are Delta Electronics, Taipei, Taiwan, Globe Motor, Dayton, Ohio, ebm/PAPST, Farmington, Conn. or NIDEC/Power General, Canton, Mass. Some operating properties for the power supply fan are an air flow rate of between about 15 and 25 cubic feet a minute (CFM) and a noise level of below 44 decibels (dB) but preferably closer to 30 dB. Some operating properties for the CPU enclosure fan are an air flow rate of between 35 and 45 CFM and a noise level of below 44 dB but preferably closer to 30 dB.

The power supply fan 314 and the CPU enclosure fan 312 are orientated and placed to move air to through the CPU monitor shelf 332 (and CPU box) and direct it upwards and over the bottom of the monitor 340 and then towards the back of the gaming machine 300 where the air exits through the vent hole 342 into the top box 302. The air moving around the monitor 340 towards the top of the gaming machine tends to cool the monitor 340. The monitor 340 is encased in a box with many holes which allows air to flow by the thermal sources generated by the various monitor components. The flow path toward the top of the gaming machine is aided by the natural convection of the hot air rising to the top of the gaming machine cabinet 311.

After the air rises past the monitor it typically exits the gaming machine cabinet 311 through a vent on the top of the gaming machine 300. A fan 304 may be located below this vent to push hot air outside of the gaming machine cabinet or the fan may be located at the bottom of the top box to pull air into the top box 302. The diameter of this fan 304 is usually between about 3 and 4 inches with one embodiment about 3.15 inches. When the top box 302 sits on top of the gaming machine cabinet 311. The hot air from the gaming machine cabinet may be vented into to the top box 302 as shown by the arrow 346. Hot air from the top box may exit the top box via one or more vents including 344 and 350. Hot air exiting from the top box is indicated by the arrow 352. The vent 344 may also allow cool air from outside the top box to enter the top box 302. The venting of hot air outside the top box 302 may be aided by a fan 303 located below the vent 350 on top of the top box. Typically, this fan may emit less noise than the fans located in the interior of the gaming machine because it is close to the exterior of the gaming machine.

As mentioned above, the accumulation of metallic dust on sensitive electrical components may cause thermal and electrical problems. The CPU enclosure fan 332 and power supply fan 314 are orientated to prevent coin dust from accumulating on the CPU and the electronic components mounted on the back plane of the gaming machine cabinet 311. A major source of metallic dust is the coin hopper (not shown) which is typically in the hopper enclosure 318. The air flow patterns 320 and 336 are designed to prevent metallic dust from accumulating on the CPU, the power supply 324 or other sensitive electronic components.

FIG. 3B is a bottom view of the drop stand in FIG. 3A. The bottom of the drop stand 316 is shown. Three vents 354 are located on the bottom of the drop stand near the back of the gaming machine cabinet 311. The vents 354 allow cool air 356 outside the gaming machine 300 to enter the drop stand 316. The vents 330 on the bottom of the gaming machine cabinet 311 are typically aligned with the vents 356 on the bottom of the drop stand 318. These vents allow cool air from the drop stand to rise into the main cabinet enclosure 328 as indicated by the arrows 325.

Figures 4A, 4B:
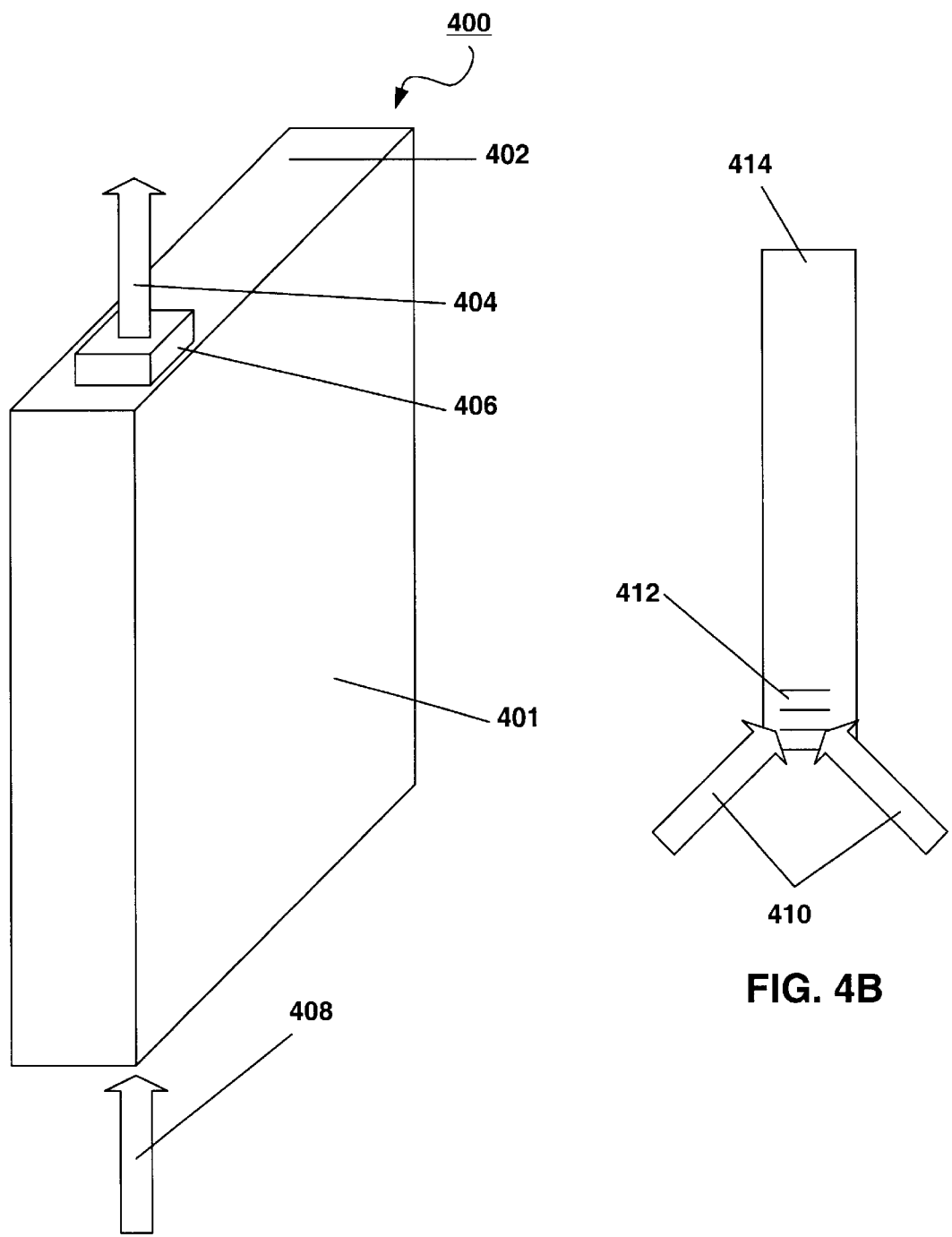
FIGS. 4A and 4B are a side view and a perspective drawing of power supply box with air flow patterns.

FIGS. 4A and 4B are a side view and a perspective drawing of power supply box with air flow patterns. The power supply 400 is encased in a power supply enclosure 401. Typically, the power supply enclosure 401 is a six-sided rectangular box. A box with similar dimension may be used in the upright gaming machine 200 or the slant top gaming machine 300. Thus, the power supplies, 238 and 324, may be interchangeable. However, the orientation of the boxes in gaming machines 200 and 300 may be different. For example, In FIG. 2A, the bottom of the power supply 414 is near the side of the gaming machine. In FIG. 3A, the bottom of the power supply 414 is near the bottom of the gaming machine.

In FIG. 4B, the bottom side of the power supply enclosure 414 is comprised of perforated sheet metal with a large number of power supply inlets 412 that allows air 410 to enter into the enclosure 401. Typically, the power supply inlets 412 are circular holes. A fan 406 mounted to the power supply box over the outlet vent draws air 408 into the power supply inlets and pushes the air 404 away from the power supply 400. An outlet vent from the power supply is located behind the fan. Typically, the diameter of the fan 406 does not extend beyond the edge of the top of the enclosure side on which it is mounted.

Figure 5A:
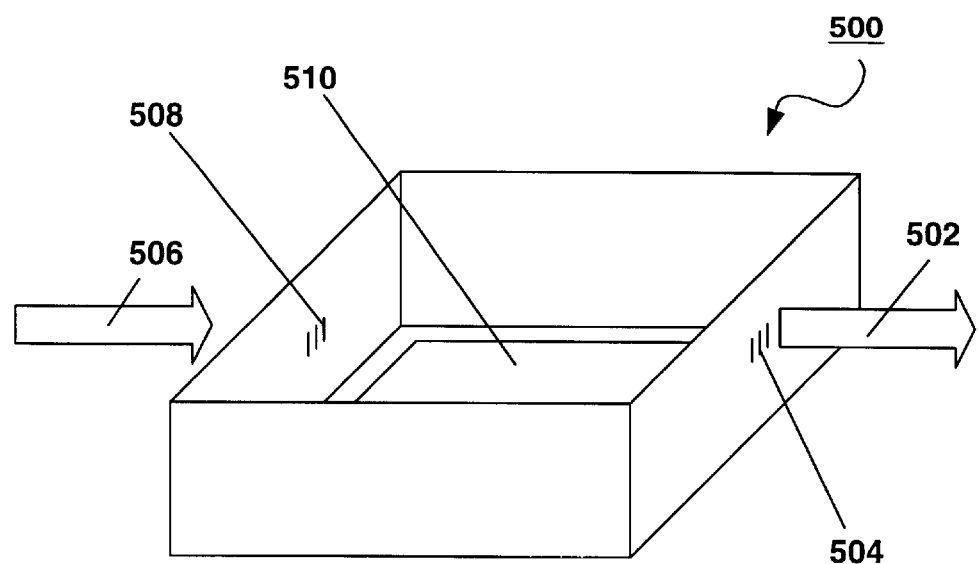
FIGS. 5A and 5B are a top view and a perspective drawing of a CPU box with air flow patterns.
Figure 5B:
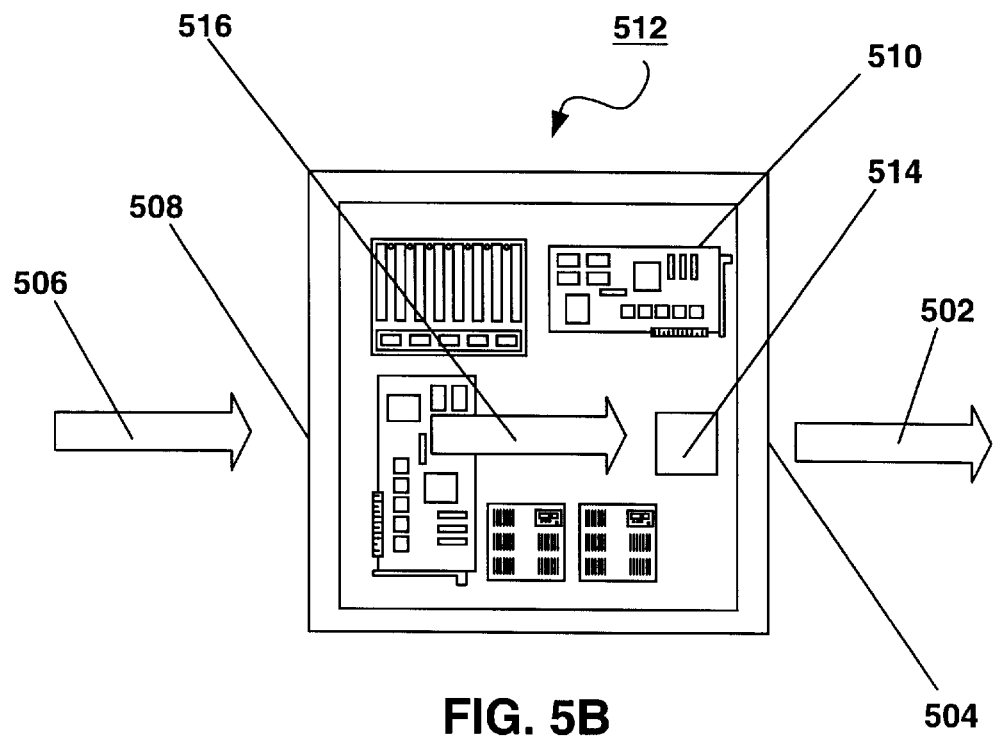

FIGS. 5A and 5B are a top view and a perspective drawing of a CPU box with air flow patterns. As described with reference to FIGS. 2A and 3A, the CPU box 500 is typically a rectangular enclosure which rests in the CPU shelves, 240 and 332. The CPU box encloses a CPU board 510 which controls the operation of many of the gaming devices on the gaming machine and allows the gaming machine to present a game. The CPU box is designed to be removable from the gaming machine. In FIGS. 2A and 3A, the CPU box 500 for the upright gaming machine 200 and for slant top gaming machine 300 may be similar such that a CPU box may be removed from an upright gaming machine 200 and used in a slant top gaming machine 300.

In general, the CPU in the CPU box 500 is a large thermal source. Thus, as described in FIGS. 2A and 3A, a fan mounted on the side of the CPU enclosure is designed to pull air 506 into the CPU box inlet, pull air 516 across the CPU board 510, and pull air 502 out the CPU outlet vent 504. In one embodiment, a fan (not shown) may be located above the CPU outlet vent. From the CPU box top view 512, a fan 514 on top of the CPU is shown. The fan 512 provides additional cooling to the CPU. Typically, the fan may be between about 3 and 4 inches in diameter and pull between about 35 and 45 CFM. In one embodiment, the diameter of the fan 3.15 inches. Typically, the thickness of the fan is about 1 inch. Some manufactures of fans of this type have been previously described. In one embodiment, the fan is directly mounted on the outside of the CPU box outlet. In another embodiment, the fan is mounted above the CPU. Some operating properties for the CPU enclosure fan are an air flow rate of between 35 and 45 CFM and a noise level of below 44 dB but preferably closer to 30 dB.

Figure 6:
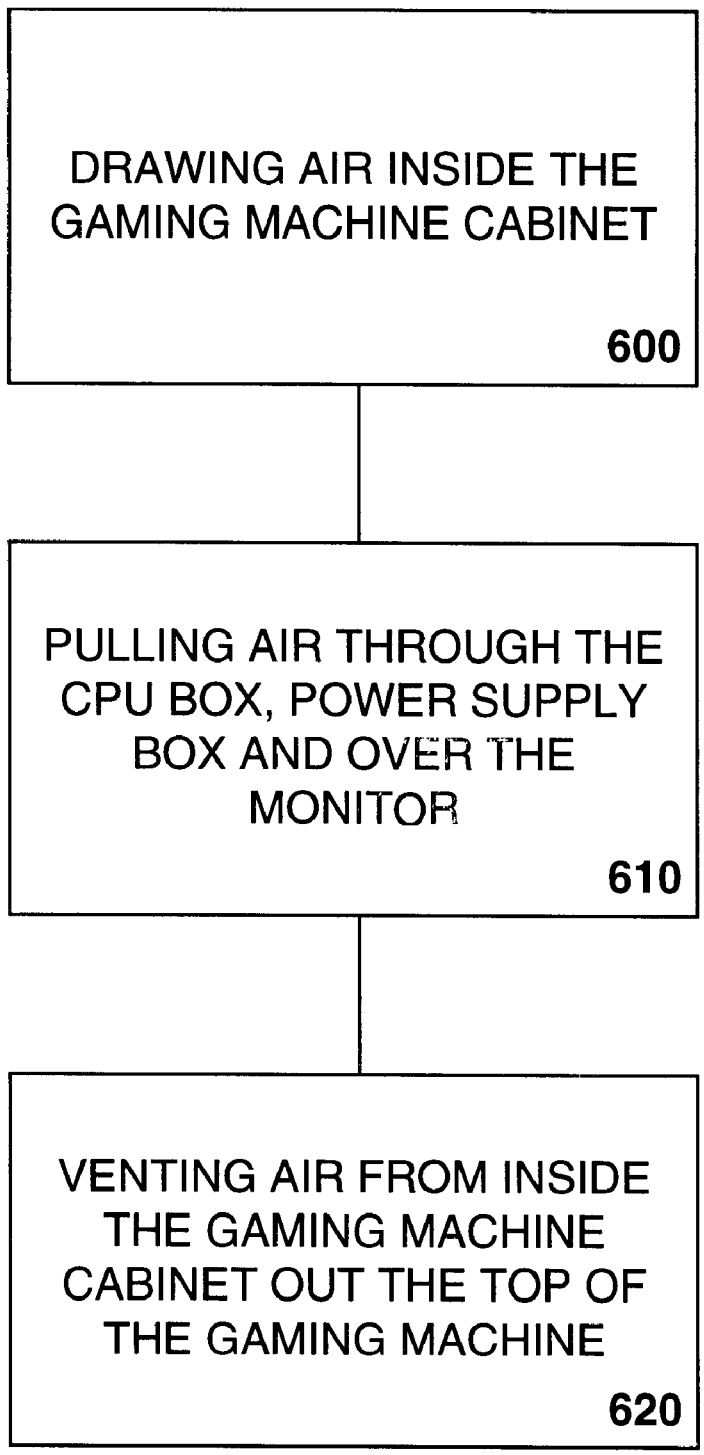
FIG. 6 is a flow chart depicting a method for cooling a gaming machine.

FIG. 6 is a flow chart depicting a method for cooling a gaming machine. In step 600, air is drawn through one or more vents or holes of some type into to the gaming machine cabinet. Usually, the vent of hole is located near the bottom of the gaming machine cabinet. It is assumed that the air outside the gaming machine cabinet near the vents is cooler than the air inside the gaming machine cabinet. In step 610, the air is pulled over the major thermal heat sources including the CPU, monitor and power supply using a combination of natural convection and fans to circulate the air. The air flowing over these devices removes excess heat emitted from the devices. In step 620, hot air from inside the gaming machine cabinet is vented outside the gaming machine cabinet from a vent typically located near the top of the gaming machine. The heat expelled with the hot air helps to a maintain a proper thermal balance within the gaming machine cabinet and hence prevents devices located within the gaming machine cabinet from overheating.

Although the foregoing invention has been described in some detail for purposes of clarity of understanding, it will be apparent that certain changes and modifications may be practiced within the scope of the appended claims. For instance, while the gaming machines of this invention have been depicted as having top box mounted on top of the main gaming machine cabinet, the use of gaming devices in accordance with this invention is not so limited. For example, gaming machine may be provided without a top box.

What is claimed is:

1. A gaming machine comprising:

a gaming machine cabinet;

a monitor mounted within the gaming machine cabinet;

a CPU mounted proximate first side of the gaming machine cabinet;

a power supply for the gaming machine mounted proximate first side of the gaming machine cabinet;

a coin hopper mounted in the gaming machine cabinet;

a first fan mounted proximate CPU and oriented to pull air over the CPU and push air toward the coin hopper; and a second fan mounted proximate the power supply and oriented to pull air over the power supply and toward the hopper.

2. The gaming machine of claim 1, wherein the power supply, the coin hopper and the CPU are located below the monitor and wherein the orientations of the first and second fans with respect to one or more walls of the gaming machine cabinet cause air to flow upward within the gaming machine cabinet and thereby cool the monitor.

3. The gaming machine of claim 1, further comprising:

a power supply box having vents and enclosing the power supply, wherein the second fan is mounted on the power supply box.

4. The gaming machine of claim 1, further comprising:

a CPU enclosure having vents and enclosing a CPU box enclosing the CPU, wherein the first fan is mounted on the CPU enclosure.

5. The gaming machine of claim 1, wherein the gaming machine is a slant top gaming machine or an upright gaming machine.

6. The gaming machine of claim 1, further comprising:

one or more vents on the first side of the gaming machine cabinet proximate to the CPU and proximate to the power supply.

7. The gaming machine of claim 6, wherein the first side of the gaming machine cabinet is a left side or a right side when facing the monitor and wherein the gaming machine is an upright gaming machine.

8. The gaming machine of claim 6, wherein the first side of the gaming machine cabinet is a front side or a bottom side of the gaming machine cabinet when facing the monitor and wherein the gaming machine is a slant top gaming machine.

9. The gaming machine of claim 6, further comprising:
A third vent proximate a top of the gaming machine cabinet wherein air is drawn into the gaming machine from the first and second vent by the CPU, by the power supply, over the monitor and upward through the third vent.

10. A thermal management system for a gaming machine, the thermal management system comprising:
a gaming machine cabinet;
one or more vents in the gaming machine cabinet wherein the one or more vents allow air from outside the gaming machine to enter the main cabinet and thereby cool the gaming machine;
a monitor mounted within the gaming machine wherein the monitor is viewable to a player facing a front side of the gaming machine and allows a player to play a game on the gaming machine;
a power supply connected to a motherboard mounted on a back side of the gaming machine cabinet wherein the power supply is provided in a power supply box that is mounted in the main cabinet;
a CPU box connected to or containing the motherboard and a CPU, wherein the CPU box is mounted in the main cabinet via a CPU enclosure;
a first fan mounted to the power supply box wherein the first fan pulls air through the power supply and thereby cools the power supply;
a second fan mounted to the CPU enclosure wherein the second fan pulls air through the CPU box and thereby cools the CPU box; and
a third fan mounted on a top of the gaming machine wherein the third fan pulls hot air rising from the monitor, the CPU and the power supply from the gaming machine cabinet and vents the hot air outside the gaming machine cabinet and thereby cools the gaming machine cabinet.

11. The thermal management system of claim 10, wherein at least one of the one or more main cabinet vents comprises a louvered vent cover.

12. The thermal management system of claim 10, wherein the gaming machine is an upright gaming machine or a slant top gaming machine.

13. The thermal management system of claim 10, wherein the first fan pulls between about 15 CFM and 25 CFM.

14. The thermal management system of claim 10, wherein the first fan produces no more that about 44 decibels of sound.

15. The thermal management system of claim 10, wherein the diameter of the first fan is between about 2 and 3 inches.

16. The thermal management system of claim 10, wherein the second fan pulls between about 35 CFM and 45 CFM.

17. The thermal management system of claim 10, wherein the second fan produces no more than about 44 decibels of sound.

18. The thermal management system of claim 10, wherein the diameter of the second fan is between about 3 and 4 inches.

19. The thermal management system of claim 10, wherein the third fan pulls between about 35 CFM and 45 CFM.

20. The thermal management system of claim 10, wherein the third fan produces no more than about 44 decibels of sound.

21. The thermal management system of claim 10, wherein the diameter of the third fan is between about 3 and 4 inches.

22. The thermal management system of claim 10, wherein the game is a video slot game, a video poker game, video black jack, video pai gow or video keno.

23. The thermal management system of claim 10, wherein a thickness of the first fan, second fan and third fan is between about 0.8 inches and 1.2 inches.

24. The thermal management system of claim 10, further comprising a monitor shelf mounted in the gaming machine cabinet below the top of the gaming machine, wherein the monitor is at least partially supported by the monitor shelf.

25. The thermal management system of claim 24, wherein the monitor shelf contains one or more holes.

26. The thermal management system of claim 25, wherein the holes are elliptical.

27. The thermal management system of claim 10, wherein the CPU box further comprises an inlet CPU box vent, and wherein the inlet CPU box vent is on a first side of the CPU box proximate a first side of the CPU enclosure.

28. The thermal management system of claim 27, further comprising a CPU enclosure vent located on the first side of the CPU enclosure proximate the inlet CPU box vent.

29. The thermal management system of claim 27, wherein the second fan mounted on the CPU enclosure is mounted on a second side of the CPU enclosure opposite the first side of the CPU enclosure.

30. The thermal management system of claim 27, further comprising a CPU enclosure vent located on the second side of the CPU enclosure opposite the first side of the CPU enclosure wherein the vent allows air to be drawn into the second fan.

31. The thermal management system of claim 27, wherein the CPU box includes a fourth fan mounted to the CPU, wherein the CPU is mounted to a CPU board within the CPU box, and wherein the fourth fan directly cools the CPU.

32. The thermal management system of claim 27, wherein at least one of the one or more main cabinet vents is located on a first side of the gaming machine cabinet, and wherein the at least one cabinet vent allows air into the main cabinet, and wherein the vent is proximate the inlet CPU box vent on the first side of the CPU box.

33. The thermal management system of claim 32, wherein the distance between a nearest main cabinet vent and the inlet CPU box vent is between than 2 and 4 inches.

34. The thermal management system of claim 27, wherein at least one of the one or more main cabinet vents is located on a bottom of the gaming machine cabinet, and wherein the at least one cabinet vent allows air into the main cabinet, and wherein the vent is proximate the inlet CPU box vent on the first side of the CPU box.

35. The thermal management system of claim 34, wherein the distance between a nearest main cabinet vent and the inlet CPU box vent is between 9 and 11 inches.

36. The thermal management system of claim 27, wherein the CPU box further comprises an outlet CPU box vent wherein the outlet CPU box vent is on a second side of the CPU box opposite the first side of the CPU box, and wherein air is pulled into the CPU box inlet and across the CPU box to the outlet CPU box vent by the second fan.

37. The thermal management system of claim 36, wherein the CPU box includes a fourth fan mounted to the CPU box proximate to the outlet CPU box vent.

38. The thermal management system of claim 10, wherein the power supply box comprises an inlet power supply vent on a first side of the power supply box.

39. The thermal management system of claim 38, wherein the power supply box comprises an outlet power supply vent on a second side opposite the first side of the power supply box.

40. The thermal management system of claim 39, wherein the first fan is mounted on the second side of the power supply box and the first fan pulls air into the power supply through the inlet power supply vent, through the power supply box and out the outlet power supply vent and thereby cools the power supply.

41. The thermal system of claim 38, wherein at least one of the one or more main cabinet vents is located on the first side of the gaming machine cabinet, and wherein the at least one vent allows air into the main cabinet and the at least one vent is proximate the inlet power supply vent.

42. The thermal management system of claim 41, wherein the distance between a nearest main cabinet vent and the inlet power supply vent is between about 2 and 4 inches.

43. The thermal system of claim 38, wherein at least one of the one or more main cabinet vents is located on a bottom of the gaming machine cabinet, and wherein the at least one vent allows air into the main cabinet and the at least one vent is proximate the inlet power supply vent.

44. The thermal management system of claim 43, wherein the distance between the nearest main cabinet vent and the inlet power supply vent is between about 1 and 2 inches.

* * * * *